US012742836B2

(12) United States Patent
Cripe

(10) Patent No.: US 12,742,836 B2
(45) Date of Patent: Sep. 22, 2026

(54) MAGNETOIMPEDANCE SENSOR

(71) Applicant: Rockwell Collins, Inc., Cedar Rapids, IA (US)

(72) Inventor: David W. Cripe, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 217 days.

(21) Appl. No.: 18/632,889

(22) Filed: Apr. 11, 2024

(65) Prior Publication Data

US 2025/0321298 A1 Oct. 16, 2025

(51) Int. Cl.
*G01R 33/06* (2006.01)

(52) U.S. Cl.
CPC .................................. *G01R 33/063* (2013.01)

(58) Field of Classification Search
None
See application file for complete search history.

(56) References Cited

U.S. PATENT DOCUMENTS 5,751,112 A 5/1998 Monma et al.
6,236,200 B1 5/2001 Nekado et al.
2012/0038358 A1* 2/2012 Honkura .............. G01R 33/063 324/252
2013/0342197 A1 12/2013 Uchiyama
2015/0153401 A1 6/2015 Tsujimoto
2017/0123016 A1 5/2017 Deak et al.
2022/0099760 A1 3/2022 Endo et al.

FOREIGN PATENT DOCUMENTS

JP 2001033533 A 2/2001

OTHER PUBLICATIONS

English translation of JP 2001-33533 A (Year: 2001).*

European Search Report dated Aug. 19, 2025 issued in corresponding application 25155441.6.

He Dongfeng et al: "Evaluation of 3D-Printed titanium alloy using eddy current testing with high-sensitivity magnetic sensor", NDT&E International, vol. 102, Nov. 19, 2018 (Nov. 19, 2018), pp. 90-95.

Nabias Julie et al: "Investigation of Bending Stress Effect on the Diagonal and Off-Diagonal Impedances for GMI Sensor Implementation", IEEE Transactions on Magnetics, IEEE, USA, vol. 53, No. 11, Nov. 1, 2017 (Nov. 1, 2017-), pp. 1-8.

Garcia-Chocano Victor Manuel et al: "DC and AC linear magnetic field sensor based on glass coated amorphous microwires with Giant Magnetoimpedance", Journal of Magnetism and Magnetic Materials, vol. 378, Nov. 26, 2014 (Nov. 26, 2014), pp. 485-492.

* cited by examiner

*Primary Examiner* — Jermele M Hollington
(74) *Attorney, Agent, or Firm* — Millen, White, Zelano & Branigan P.C.; William F. Nixon

(57) ABSTRACT

Applied magnetic fields are evaluated using portions of the B-H curve of a material exposed to the applied magnetic field. The portions of the B-H curve being evaluated may reside near the top and bottom of the curve where non-linear results in the curve occur. Selective sampling of nonlinear regions of the B-H curve are performed to determine the direction and strength of the applied magnetic field.

19 Claims, 4 Drawing Sheets

MAGNETOIMPEDANCE SENSOR

FIELD OF THE INVENTION

The present invention relates to sensing magnetic fields. More specifically, methods, devices, systems and articles of manufacture employing magnetoimpedance sensing circuit topologies or magnetoimpedance sensing processes are provided herein.

BACKGROUND

Magnetoimpedance generally addresses changes of impedance of a material when an external magnetic field is applied to the material. Impedance changes may be observed to determine values of the fluctuations in an applied magnetic field. Sensors employing magnetoimpedance can comprise ferromagnetic materials reflecting changes in their impedance depending upon the magnetic field being applied to the ferromagnetic materials.

Ferromagnetic materials can exhibit magnetic hysteresis, which is often considered to be the lag a magnetic material demonstrates when becoming magnetized and demagnetized upon being exposed to an applied changing external magnetic field. The often drawn B-H curve, which are also called magnetism curves or magnetic hysteresis curves, shows flux density (B) plotted against the magnetic field strength (H). This B-H curve is a graphical representation of the magnetic hysteresis for a particular material. The B-H curve of many materials can be described as having an approximate s-curve shape with asymptotic regions and linear regions of the graphed curve.

A need may be appreciated for physically compact, environmentally robust magnetoimpedance sensors exhibiting high sensitivity and low noise that may be applied as magnetic dipole antennas or in other configurations for detection of RF magnetic fields. This need may be further appreciated in the application of an electrically-small magnetic antenna.

SUMMARY

Embodiments may comprise methods for determining an applied magnetic field. These methods may comprise applying an alternating excitation voltage to a first magnetoimpedance sensor, the first magnetoimpedance sensor comprising a winding and a core material, biasing the applied excitation voltage with an applied DC current, sampling a resultant output at a node positioned between the applied voltage and the alternating excitation voltage; and determining an applied external magnetic field exposed to the first magnetoimpedance sensor. In some instances, the applied DC current may operate to limit outputs of the first magnetoimpedance sensor to fall outside of a linear region of a B-H curve of the first magnetoimpedance sensor. Embodiments may also comprise the core having a ferrous material and a radio frequency choke being positioned between a source of the applied DC current and the first magnetoimpedance sensor. Embodiments may also comprise the applied excitation voltage being an alternating voltage as well as applying an alternating excitation voltage to a second magnetoimpedance sensor, the second magnetoimpedance sensor comprising a winding and a core material, and the second magnetoimpedance sensor being electrically connected in parallel to the first magnetoimpedance sensor.

In some embodiments, a node may be electrically positioned between the first and second magnetoimpedance sensors and a synchronous detector and the synchronous detector may be configured to output a dc voltage indicative of the applied external magnetic field exposed to the first magnetoimpedance sensor. And, sampling the resultant output at the node may be positioned between the applied voltage and the alternating excitation voltage and may be conducted by a synchronous detector.

In some embodiments, the applied DC current may operate to limit outputs of the first magnetoimpedance sensor to fall outside of a linear region of a B-H curve of the first magnetoimpedance sensor and within a knee region of the B-H curve of the first magnetoimpedance sensor.

Embodiments may also comprise a circuit for determining an applied magnetic field where the circuit may comprise an alternating excitation voltage source electrically coupled to a first magnetoimpedance sensor, the first magnetoimpedance sensor comprising a winding and a core material, the alternating excitation voltage source electrically coupled in parallel to a second magnetoimpedance sensor, the second magnetoimpedance sensor comprising a winding and a core material and a biasing current source configured and electrically connected to apply a biasing DC current to a node coupled in parallel to both the first magnetoimpedance sensor and the second magnetoimpedance sensor. A choke may also be positioned between the biasing current source and the alternating excitation voltage, wherein the biasing current source may be set to output a DC current value that operates to limit outputs of the first magnetoimpedance sensor to fall outside of a linear region of a B-H curve of the first magnetoimpedance sensor and to limit outputs of the second magnetoimpedance sensor to fall outside of a linear region of a B-H curve of the second magnetoimpedance sensor. In some embodiments, the choke may be a radio frequency choke positioned between the biasing current source and the node coupled in parallel to both the first magnetoimpedance sensor and the second magnetoimpedance sensor. In some embodiments, the first magnetoimpedance sensor and the second magnetoimpedance sensor may be the same. In some embodiments, the alternating excitation voltage source may be configured to output a square wave, and in some embodiments, a synchronous detector may be present, the detector electrically coupled to the node and configured to output a dc voltage indicative of an applied external magnetic field exposed to the first magnetoimpedance sensor and the second magnetoimpedance sensor.

Still further, some embodiments may have the first magnetoimpedance sensor and the second magnetoimpedance sensor comprise a core having a diameter of no more than 0.1 mm. Also, embodiments may have the biasing current source configured and electrically connected to apply a biasing DC current set to 5 volts or less to a node coupled in parallel to both the first magnetoimpedance sensor and the second magnetoimpedance sensor.

These, as well as other embodiments, aspects, advantages, and alternatives, will become apparent to those of ordinary skill in the art by reading the following detailed description, with reference where appropriate to the accompanying drawings. Further, this summary and other descriptions and figures provided herein are intended to illustrate embodiments by way of example only and, as such, numerous variations are possible. For instance, structural elements and process steps may be rearranged, combined, distributed, eliminated, or otherwise changed, while remaining within the scope of the disclosed embodiments.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE EMBODIMENTS

Figure 1:
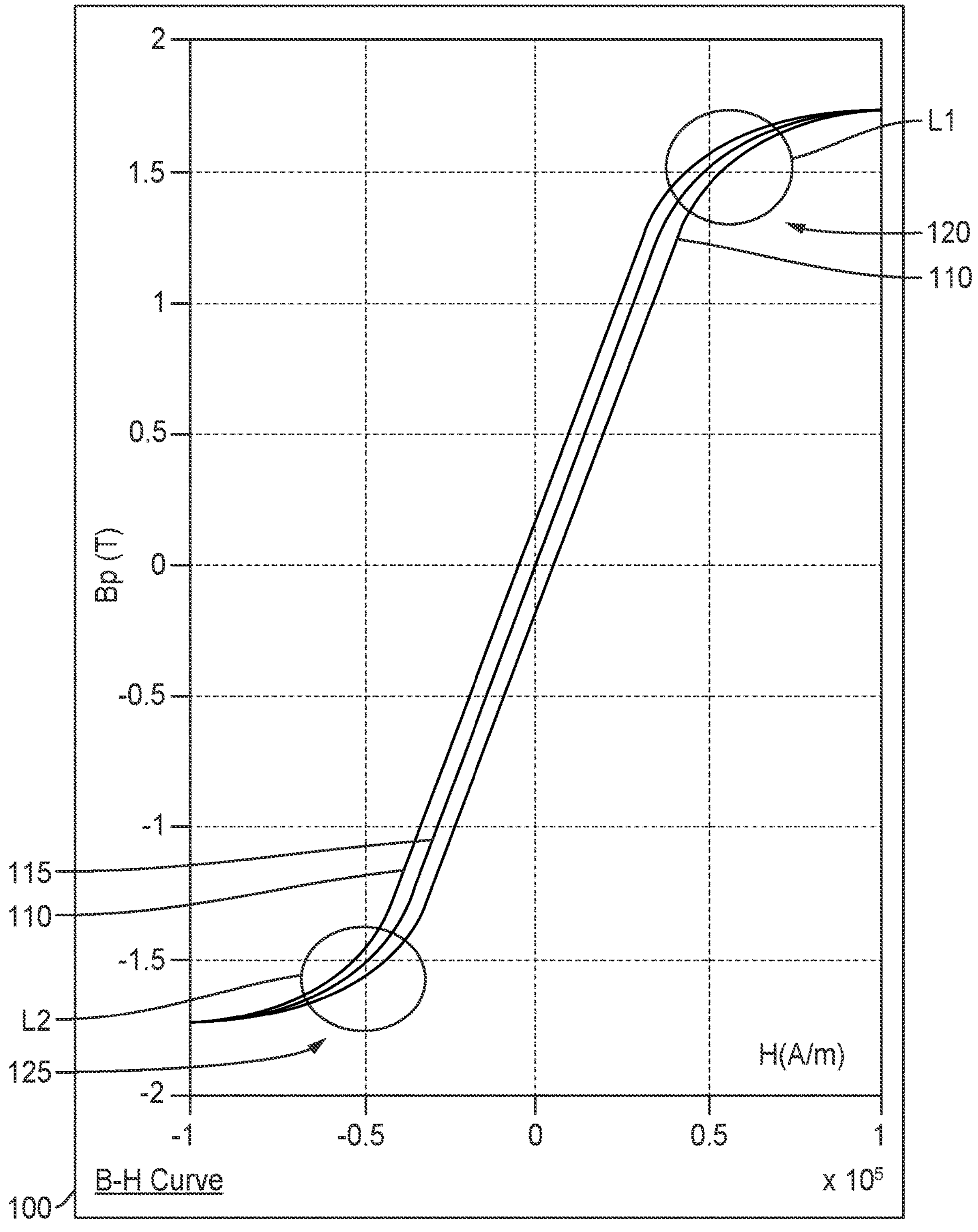
FIG. 1 illustrates the B-H curve of exemplary material used in magnetoimpedance sensors as may be employed in some embodiments.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of the embodiments of the inventive concepts, numerous specific details are set forth in order to provide a more thorough understanding of the inventive concepts. It will be apparent to one skilled in the art, however, having the benefit of the instant disclosure that the inventive concepts disclosed herein may be practiced without these specific details.

As used herein, a letter following a reference numeral is intended to reference an embodiment of the feature or element that may be similar, but not necessarily identical, to a previously described element or feature bearing the same reference numeral, such as 1, 1a, or 1b. Such shorthand notations are used for purposes of convenience only, and should not be construed to limit the inventive concepts disclosed herein in any way unless expressly stated to the contrary.

Moreover, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes plural unless it is obvious that it is meant otherwise. It will be further understood that the terms "comprises" or "comprising," when used in this specification, specify the presence of stated features, integers, steps, operations, elements, or components, but do not preclude the presence or addition of one or more other features, integers, steps, operations, elements, components, and/or groups thereof.

As used herein, any reference to "one embodiment," "alternative embodiments," or "some embodiments" means that particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination or sub-combination of two or more such features, along with any other features that may not necessarily be expressly described or inherently present in the instant disclosure.

The inventive concepts may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts, or combinations of special purpose hardware and computer instructions. Inventive concepts may be implemented as a computer process, a computing system or as an article of manufacture such as a computer program product of computer readable media. The computer program product may be a computer storage medium readable by a computer system and encoding computer program instructions for executing a computer process. When accessed, the instructions cause a processor to enable other components to perform the functions disclosed below.

Embodiments may seek to quantify an applied magnetic field by evaluating portions of the B-H curve of a material exposed to the applied magnetic field. The portions of the B-H curve being evaluated may reside near the top and bottom of the curve where non-linear results in the curve occur. These top and bottom portions of the B-H curve of the material may be considered to be asymptotical in appearance and may be identified as the 'knee' regions of the curve. These knee regions may be evaluated in embodiments while the linear or near linear regions of the B-H curve, which connect the knee regions, may be discarded in order to improve accuracy of sensing the applied magnetic field in some embodiments by focusing on the feedback that is more indicative of the direction and strength of the applied magnetic field.

The saturation of magnetic permeability of a wire during current peaks in the excitation waveform results in a corresponding collapse in the impedance of an associated inductance coil, and a sudden drop in the voltage across the coil. The presence of an ambient magnetic field creates an asymmetry in the magnetic flux within the core wire, distorting the voltage waveform present at the electromagnet coil in such a manner that the resultant waveform contains a component of the excitation waveform, with an amplitude and phase determined by the magnitude and orientation of the applied magnetic field. This term may be detected in embodiments through the use of a product detector synchronized to the excitation waveform.

In some embodiments, a magnetic field may be quantified or detected by considering the asymmetry of saturation points of paired magnetoimpedance sensors in embodiments. As such, a distortion may be identified as between the paired magnetoimpedance sensors and this distortion may be employed to detect or even quantify the magnetic field applied to the magnetoimpedance sensors. Circuit embodiments may employ a radio frequency choke or other conditioning circuitry for a biasing source such that asymmetrical signals from a pair of magnetoimpedance sensors exposed to a periodic current can be read and converted to a value and sign of a magnetic field acting on the magnetoimpedance sensors. Process embodiments may apply a periodic excitation current to a pair of magnetoimpedance sensors to detect asymmetry in the saturation points of the pair of magnetoimpedance sensors and detect any distortion of a voltage waveform in order to detect the presence of a magnetic field. This detection of distortion, in embodiments, may occur in the knee region of the B-H curve or outside of it as well.

Placing paired or grouped magnetoimpedance sensors into a state where there is an external magnetic field equally applied to the cores of these sensors can produce a shift from quiescent state (in the same direction) of the sensors in the pair. Upon moving from the quiescent state, a core of one sensor in the pair or grouping may enter a more fully saturated region and a core of another sensor in the pair or grouping may enter a less saturated region. As such, an asymmetry can be seen in net permeability and this asymmetry can serve to create nonlinearity. This nonlinear response resides in the nonlinear region of the B-H curve of the sensor cores, and serves as the area in which magnetic field data may be provided in embodiments. Given that this data is taken from the nonlinear region of the cores B-H curve, and not necessarily along the linear regions of the B-H curve for the cores, the data received is much more likely to reflect quantifiable values indicative of the magnetic field as compared to data taken from the linear regions of the cores B-H curve. By taking data from this nonlinear region, increased sensitivity for the paired magnetoimpedance sensors having a core of that particular size may be improved. Thus, symmetrically driving waveforms (magnetic fields) for nominally symmetrical output, of paired magnetoimpedance sensors, may be provided in embodiments. And, phasing of this term in comparison to the external excitation magnetic field can show the direction of the external excitation magnetic field. The value of a quiescent state may be determined using symmetrical loading when there is no nominal external field.

Magnetoimpedance sensors of embodiments may comprise a core of ferrous material. This material may have a small diameter with a large length to diameter ratio. The diameter may be on the order of about 0.1 mm with length of about 1 mm or more. The ferrous material of these cores may be selected to have a very high permeability, such as 50/50 nickel-iron alloy or an amorphous magnetic alloy, as well as other materials. These amorphous magnetic alloys may be considered to comprise a large number of sub-elements selected to have different atomic sizes, and which, when melted and quenched, form a hard glass-like alloy. This amorphous magnetic alloy is magnetically soft so it does not maintain a magnetic flux after excitation for a long duration, and the alloy has low magnetic hysteresis.

Opposite periodic currents may be applied to paired ferromagnetic materials in embodiments in order to create resultant magnetic fluxes in each material that, in the large part, cancel each other out. The resulting noncancelled signals may be used as a basis to measure the strength and direction of the applied external magnetic field. Such techniques and topologies may serve to provide suitable or enhanced sensitivity and suitable or reduced noise of magnetoimpedance sensors. Ferromagnetic materials employed in embodiments may exhibit minimal hysteresis and a very abrupt transition into saturation. These abrupt transitions may be sensed along the B-H curve or otherwise and may be considered to determine the amount and direction of any applied magnetic fields.

In embodiments, a sensor system may comprise two magnetoimpedance devices magnetically biased at the positive and negative threshold of saturation, respectively. When connected in series and driven differentially with an RF excitation signal, an applied magnetic field will result in an asymmetry of saturation between the two impedances, resulting in a signal at the node of their common connection containing a term at the frequency of excitation, with an amplitude and phase corresponding to the magnitude and orientation of the applied magnetic field. Such output may result in reduced noise or enhanced sensitivity when sampled and analyzed to determine the value and direction of applied magnetic fields to the sensor system.

As mentioned above, embodiments may take advantage of the fairly linear outputs between the top and bottom of a material's B-H curve. The linear outputs may be cancelled though the application of oppositely correlating input currents. Now cancelled, a more tailored comparison of the outputs from the top and bottom (often called the 'knee' regions as noted above) of the B-H curves for each material can be conducted to measure applied magnetic fields. The non-linearity of the saturable magnetic core of these materials in the 'knee' regions of the B-H curve is understood to give rise to the effectiveness of magnetoimpedance sensors of some embodiments.

Sampling of some of the knee regions, which are approximately identified in FIG. 1 with ovals, between 0.4 and 0.6 Gauss, and the corresponding −0.4 and −0.6 Gauss, as well as other knee regions, may be conducted to determine the value and direction of applied magnetic fields by the sensor system. As external magnetic fields are applied to the sensor system, shifts in the operating point to the left or right serve to create a change in the net permeability presented to the inductor by the ferromagnetic core. This change in permeability may then be employed to quantify the applied external magnetic fields.

It is understood that the change in net permeability of the magnetoimpedance core in a sensor system in response to an external magnetic field shifting the bias point of the B-H curve may be utilized to detect the presence and magnitude of the external magnetic field. This is done by reducing the amplitude of the excitation waveform, and adding a steady-state bias to place the flux excursion within the magneto-impedance core to reside within one or the other of the knee regions in the BH curve. (A radio frequency choke is identified in FIG. 2 as serving to assist in providing a steady state bias but other circuit topologies may also be employed to provide a steady state bias.) By restricting the flux excursion to the region of maximum nonlinearity of the permeability of the magnetoimpedance core, the substantial period during the excitation waveform cycle in which the flux traverses a linear region of permeability is eliminated, and the effective gain of the system can be increased.

In some embodiments, a second identical magnetoimpedance sensor may be provided and may be oriented parallel to the first. The second sensor may be biased into the knee region opposite to that of the first sensor, so that the flux vectors of the magnetic bias of each sensor are oriented in opposite directions. This bias may be provided either through electromagnet coils or through fixed permanent magnets in proximity to the coils. The knee regions may then be read to determine the value and direction of any applied magnetic fields.

In embodiments, electromagnet coils surrounding a saturable ferromagnetic cores may be excited by a periodic alternating current waveform that traverses the upper and lower limits of the magnetic knee region in each of the two magnetoimpedance sensors. The polarity of these electromagnet coils may be such that the vector orientation of the excitation magnetic field is in the same direction. In some embodiments, the two excitation coils may be connected electrically in series to share the common current. In some embodiments, the two terminals of the series-connected magnetoimpedance sensor coils may be driven in push-pull synchronization by complementary voltage signals. In some embodiments, a steady state bias current may be introduced into a common node between the excitation coils through a high RF impedance such as a large value resistor or RF choke.

It is understood that during the application of the excitation magnetic field to the magnetoimpedance sensors, the permeability of the core will be proportional to the slope of the B-H curve of the sensor core as it cycles within the knee region of flux excitation, and correspondingly, the impedance of the sensor to the alternating excitation current will be affected proportionately. Utilizing a pair of sensors driven in push-pull, the complementary excitation waveform yields a voltage at the common node that is nulled and near zero when in the condition of a net zero external magnetic field. When this condition is unbalanced by the application of an external magnetic field, this field will add constructively to the bias field of one sensor and subtract from the other sensor. Consequently, the permeability of one core increases, the permeability of the other core will simultaneously diminish. Observing the common node connecting the excitation coils of the sensors, a signal will be present that is at the same frequency as the excitation signal, of an amplitude and sign related to the amplitude and direction of the applied external magnetic field. This signal may be subsequently interpreted as a proxy for the amplitude and direction of the external magnetic field. Certain magneto-impedance sensors may be considered a class of magnetic field sensors similar to flux gates in that the sensors provide information based on the response of a saturable magnetic core of the sensor in response to an applied external periodic magnetic field.

Embodiments may be configured to isolate excitation signals to solely fall within the nonlinear knee region of the B-H curve. In so doing, output signals carrying little meaningful data, may be avoided. This may be explained by considering that permeability of a magnetic core may be expressed as a function of saturation flux. Second order derivative of the change in permeability versus change of applied current or applied flux. This nonlinearity is peaked and at its highest in the corners of the graph of permeability v flux, which, as noted above, are recited as knee areas. Utilizing the summed signals from the two knee regions, there is no imbalance between the signals, and the excitation signal is cancelled. Consequently, as described herein, isolating the excitation circuit to only fall within the knee region of the B-H curve, as opposed to falling within the linear region of permeability, can serve to provide heightened or otherwise better sensor results. In other words, little or no signal may be generated in the linear region of permeability in embodiments and the signals that are generated may be more meaningful and may provide improved sensitivity due to the removal of unimportant data.

Embodiments may bias magnetoimpedance sensors with residual current sized limit outputs from the magnetoimpedance sensors to falls outside of the linear or near linear regions of the B-H curve. The biasing can serve to remove most or all linear feedback from the sensors, thereby improving the significance of any remaining outputs from the magnetoimpedance sensors.

FIG. 1 depicts the B-H curve 100 of exemplary material used in magnetoimpedance sensors as may be employed in some embodiments. As can be seen in FIG. 1, the amplitude of the excitation flux in the core wire may typically extend to +/−1 G, sufficient to saturate a core in both directions. Knee areas 120 are labelled along with linear or nearly linear areas 110. The material depicted in FIG. 1 may be considered magnetically soft, which does not materially maintain a magnetic flux after excitation and has a low magnetic hysteresis.

FIGS. 1 and L1 and L2 may also represent knee regions of two independent sensor cores under a concurrent applied magnetic field. One of the cores being biased so that its flux excursion falls in the lower left hand circle 125 and the other one resides in the upper right hand circle 120. When the variances of each senor cores are combined you end up with a line 115 reflecting the average of the two. When there is not a perfect cancellation from the two sensors in the knee areas, the result is that a portion of the excitation signal, which may be considered in embodiments and employed to evaluate the applied magnetic field experienced by the sensors. As noted above, and as shown below in FIG. 2, pairs or groupings of sensors may have one set of sensors biased by a steady state positive current and one set of sensors biased by a steady state negative current. Other techniques may also be employed to promote biasing of a sensor in order to accentuate the output signal for evaluation. For example, a closed loop aeromagnetic device, such as square or rectangular or circular toroid, which may be excited in this steady state quiescent magnetic field in both positive and negative directions, may be employed in some embodiments.

In some embodiments an alternating excitation current may be employed to draw out readings residing on the two knee regions of the BH curve. More particularly, two sensors may operate in the upper and lower knee region and their outputs may be combined to result in a condition of symmetry that generates a zero net output in order to determine the electromagnetic field quiescent state. This or other features taught herein may serve to meaningfully improve sensitivity.

Figure 2:
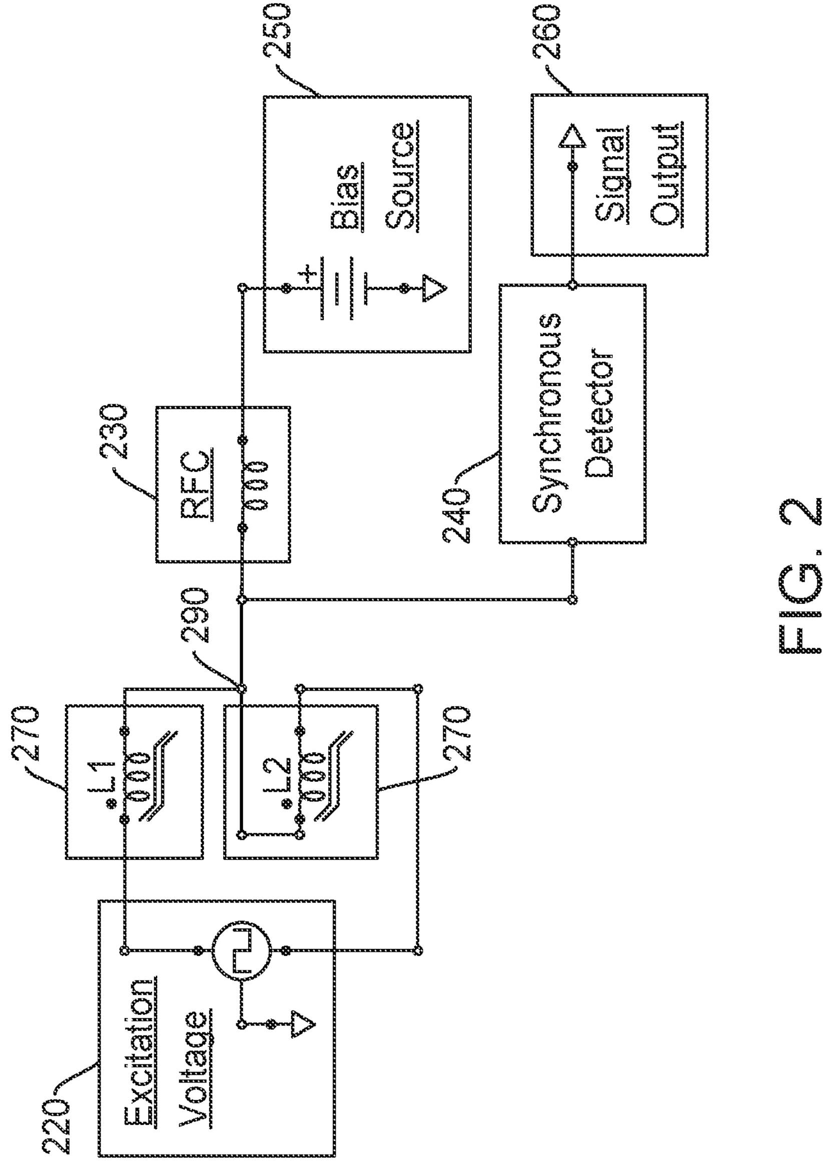
FIG. 2 illustrates a circuit topology with paired magnetoimpedance sensors as may be employed in some embodiments.

FIG. 2 depicts a circuit topology with paired magneto-impedance sensors 270 as may be employed in some embodiments. Magnetic cores of sensors 270 can be independent as shown in FIG. 1. Magnetic cores of embodiments can also be part of a magnetic circuit with a closed magnetic path and either square, rectangular, or circular shape. Still further, magnetic cores of embodiments may also two coils on the same core but not coaxial and not collocated. The excitation voltage 220 is applied to windings that are connected in series of sensors 270 and that excitation is periodic and may be a square wave as shown it may also be a triangular ramp, or saw tooth or it may be sinusoidal, as well as other alternating configurations. Reference voltage of the excitation voltage may be 5 volts and may be set so that sufficient current to move the flux of the sensors 270 into the knee region is provided. Thus, the current applied depends on the core material of the sensors 270, how many turns are present in the sensors, and the voltage that is applied. In some embodiments, the sensors 270 may be small, with a core diameter typically 0.1 mm and a length of 1.0 mm. Other sizes may also be employed provided that a suitable elongated aspect ratio is maintained. Likewise, the wire wound around the core is the same or smaller. RFC choke 230, a radio frequency choke inductor of sufficient inductance, is also shown in FIG. 2. The presence of the RFC choke may provide that any alternating voltage applied to either end of the circuit topology results in no rf current or no ac current flow with respect to the amplitude of the steady state passing through it. The RFC choke 230 may establish that the biasing current from the bias source is steady state dc with no ac component or very little ac component. In embodiments, bias source 250 may be some small voltage, smaller than the amplitude of the excitation voltage, and only sufficient to move the center of the BH curve from the center to the knee area. A synchronous detector 240 is also shown in FIG. 2. The synchronous detector 240 may be considered a vector RF detector. This detector 240 may be configured to detect the applied magnetic field. The detector 240 may take the excitation voltage and use a frequency doubling as a mixer input to the 2nd harmonic term at the junction of L1 and L2 and then apply a multiplicative process where the output is equal to the amplitude and vector direction of the external magnetic field being applied and that sensors 270 are sensing.

Also visible in the circuit topology of FIG. 2 is the parallel connection of detector 240 with the sensors 270. Through this connection topology a dc signal output 260 from the detector 240 may be a dc level that is directly proportional to the magnetic field that is applied to sensors 270. This dc level may be considered a signal vector that has a sign and an amplitude that is proportional to the magnetic field that sensors 270 see.

In FIG. 2 and in some embodiments, a high impedance current source can replace the radio frequency choke 230. For example, a collector of a bipolar transistor may feed it. Also, it is understood that what is seen at the common node 290 is the 2nd harmonic signal. A high impedance source may be employed in embodiments to feed the bias 250. impedance source. Still further, in embodiments, a signal may be detected by a circuit employing a mixer or product detector driven by a frequency term at the excitation frequency to generate a DC term proportional to the amplitude and sign of the circuit output node.

Figures 3, 4:
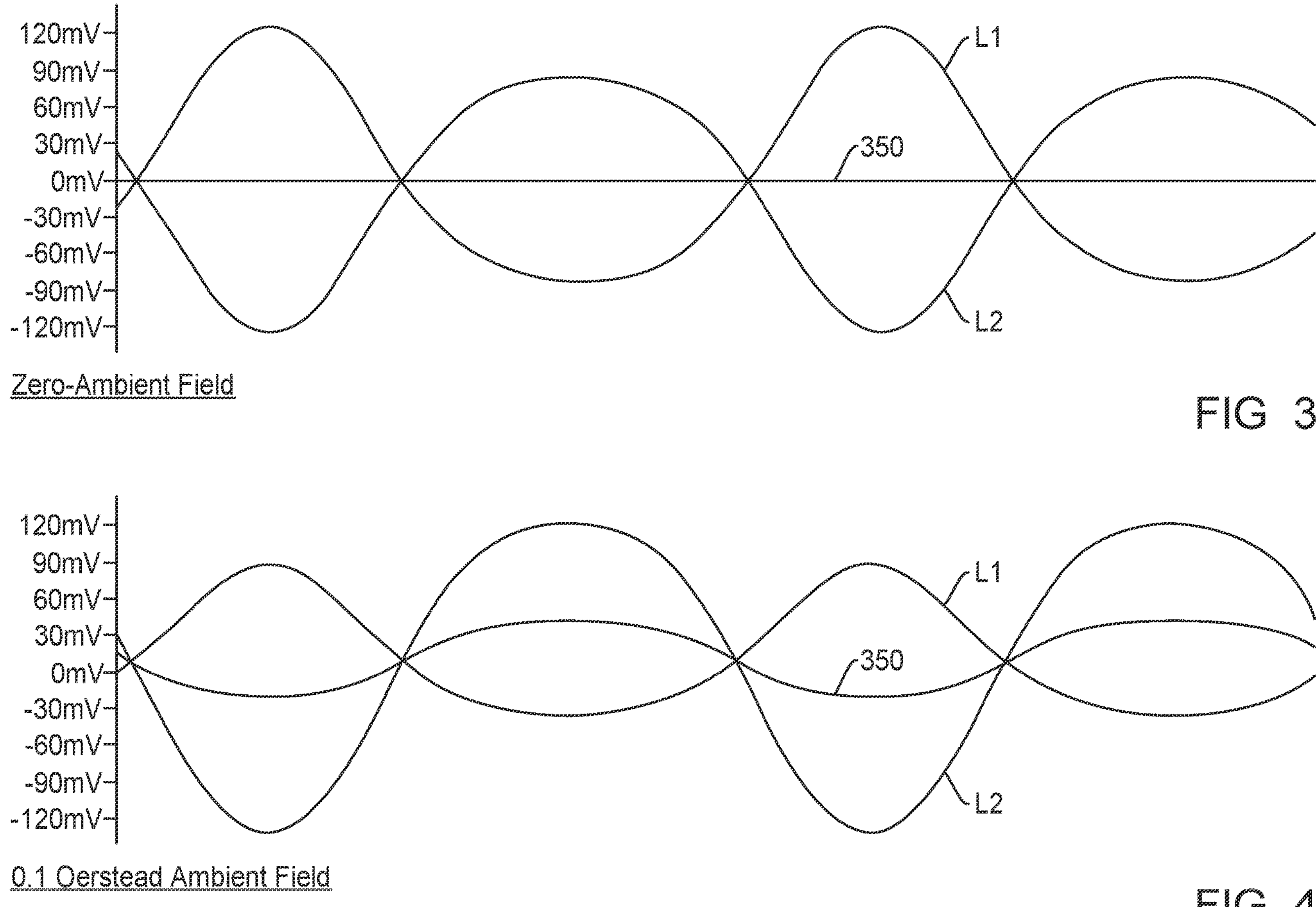
FIG. 3 illustrates a sample waveform as may be seen by a detector in some embodiments.
FIG. 4 illustrates a sample waveform as may be seen by a detector in some embodiments.

FIG. 3 depicts a sample waveform as may be seen by a detector 240 in some embodiments. In FIG. 3, a sample waveform of an exemplary implementation of the sensors for zero external field conditions is shown.

FIG. 4 depicts a sample waveform as may be seen by a detector 240 in some embodiments. In FIG. 4, a sample waveform of an exemplary implementation of the sensors in an 0.1 Oerstead field conditions is shown.

In FIG. 3, there is zero external magnetic field, and both inductors are balanced, so the drive signal is nulled at their common node. However, in the conditions depicted at FIG. 4, an 0.1 Oerstead field is applied to the system, in the same direction as the bias of L1, moving L1 further into saturation reducing its inductance, and in the opposite direction as the bias of L2, moving L2 further out of saturation increasing its inductance. This unbalances the circuit, so that a portion of the drive signal is present at the common node between L1 and L2, labeled $V_{Output}$ 350.

Figure 5:
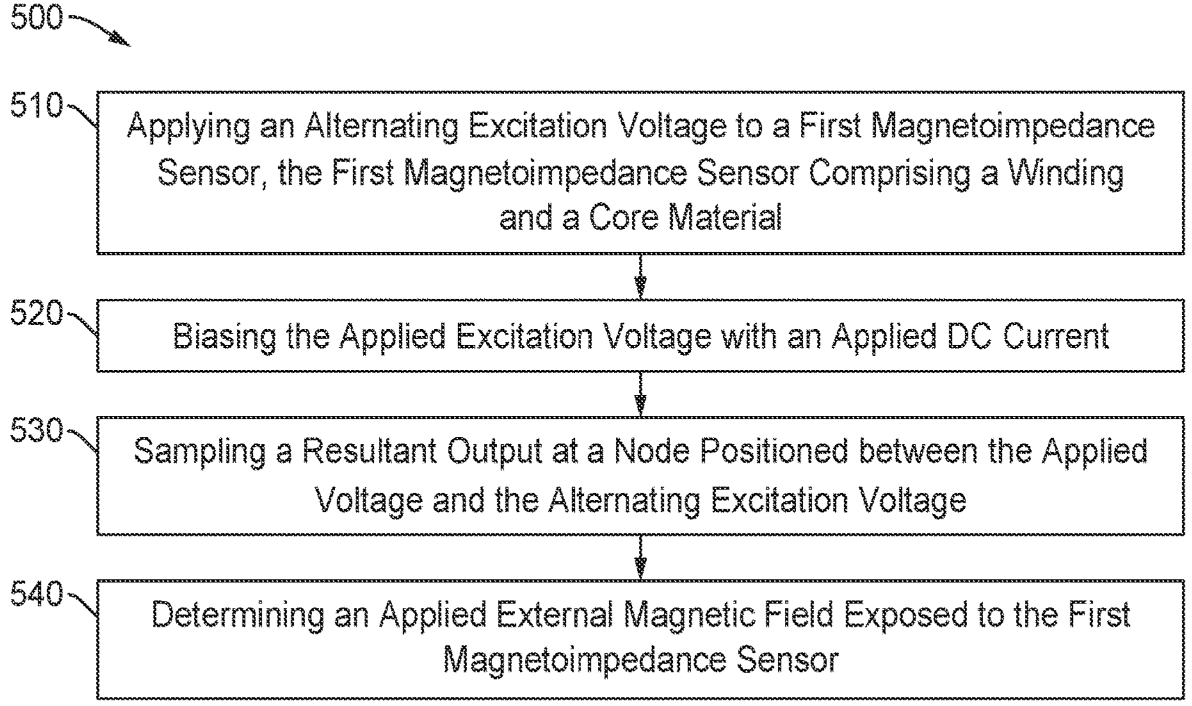
FIG. 5 illustrates a process that may employed in some embodiments.

FIG. 5 depicts a process 500 as may be applied in some embodiments. This process 500 may be conducted in various orders consistent with the teachings herein. Process 500 includes at 510 applying an alternating excitation voltage to a first magnetoimpedance sensor, the first magnetoimpedance sensor comprising a winding and a core material. And at 520, biasing the applied excitation voltage with an applied DC current, And at 530 sampling a resultant output at a node positioned between the applied voltage and the alternating excitation voltage. And, at 540, determining an applied external magnetic field exposed to the first magnetoimpedance sensor, wherein the applied DC current operates to limit outputs of the first magnetoimpedance sensor to fall outside of a linear region of a B-H curve of the first magnetoimpedance sensor.

Embodiments may use a magnetoimpedance sensor with a common, toroidal core and with two windings on opposite sides of the toroid. The closed magnetic path permits the fixed magnetic biasing with substantially ampere-turns due to the lower reluctance of the closed magnetic path.

Embodiments may include a feedback circuit in which a control loop is established in which delivers current through an electromagnet coil surrounding the magnetoimpedence sensors, serving to counter any applied magnetic fields, permitting the sensors to operate at an effective zero net flux. This can promote the effect of improving both the linearity and dynamic range of the sensor system.

Embodiments may comprise a magnetic sensor circuit, comprising a pair of magnetoimpedance devices, each comprised of a segment of ferromagnetic material possessing very abrupt transition into saturation and minimal magnetic hysteresis, in a parallel or coaxial orientation. These may be close-wound by an electromagnetic coil. A bias current may be provided through each coil and may place the quiescent magnetic flux in each core at the point of maximum nonlinearity in the B-H curve of the magnetic material. The axis of bias magnetization of each magnetoimpedance device may thereby be oriented in opposite directions.

Embodiments may comprise a device where magnetoimedance sensor coils may be excited by a periodic signal of sufficient amplitude and frequency so as to induce within the magnetoimedence device a magnetic flux excursion of sufficient amplitude to traverse above and below the region of maximum nonlinearity within the B-H curve of the magnetic core material of the magnetoimpedance devices, and the orientation of the excitation magnetic flux vectors in the device cores is in the same direction.

Embodiments may comprise a voltage across each magnetoimpedance device that may be subtracted to observe the effects of the nonlinearity of the core permeability resulting from the magnetic flux in each sensor device.

Embodiments may comprise an effect of superimposition of an external magnetic field upon the bias and excitation fields in each sensor core to result in the presence of a signal being proportional to the excitation waveform, the amplitude and polarity of this signal being related to the amplitude and orientation of the external magnet field.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, the present invention may take the form of a computer program product embodied in any tangible medium of expression having computer-usable program code embodied in the medium.

The corresponding structures, material, acts, and equivalents of all means or steps plus function elements in the claims below are intended to include any structure, material or act for performing the function in combination with other claimed elements are specifically claimed. The description of the present invention has been presented for purposes of illustration and description, but is not intended to be exhaustive or limited to the invention in the form disclosed. Many modifications and variations will be apparent to those of ordinary skill without departing from the scope and spirit of the invention. The embodiment was chosen and described in order to best explain the principles of the invention and the practical application, and to enable others of ordinary skill in the art to understand the invention for embodiments with various modifications as are suited to the particular use contemplated.

The invention claimed is:

1. A method for determining an applied magnetic field, the method comprising:

applying an alternating excitation voltage to a first magnetoimpedance sensor, the first magnetoimpedance sensor comprising a winding and a core material;

applying the alternating excitation voltage to a second magnetoimpedance sensor, the second magnetoimpedance sensor comprising a winding and a core material, the second magnetoimpedance sensor electrically connected in parallel to the first magnetoimpedance sensor;

biasing the applied excitation voltage with an applied DC current;

sampling a resultant output at a node positioned between the applied voltage and the alternating excitation voltages from the first magnetoimpedance sensor and the second magnetoimpedance sensor; and determining an applied external magnetic field exposed to the first magnetoimpedance sensor, wherein the applied DC current operates to limit outputs of the first magnetoimpedance sensor and the second magnetoimpedance sensor to fall outside of a linear region of a B-H curve of the first magnetoimpedance sensor, and wherein the outputs of the first magnetoimpedance sensor and the second magnetoimpedance sensor are combined to generate a zero net output.

2. The method of claim 1 wherein the core comprises a ferrous material and wherein a radio frequency choke is positioned between a source of the applied DC current and the first magnetoimpedance sensor.

3. The method of claim 1 wherein the applied excitation voltage is an alternating voltage.

4. The method of claim 1 wherein the node is electrically positioned between the first and second magnetoimpedance sensors and a synchronous detector, the synchronous detector configured to output a dc voltage indicative of the applied external magnetic field exposed to the first magnetoimpedance sensor.

5. The method of claim 1 wherein sampling the resultant output at the node positioned between the applied voltage and the alternating excitation voltage is conducted by a synchronous detector.

6. The method of claim 1 wherein the applied DC current operates to limit outputs of the first magnetoimpedance sensor to fall outside of a linear region of a B-H curve of the first magnetoimpedance sensor and within a knee region of the B-H curve of the first magnetoimpedance sensor.

7. A circuit for determining an applied magnetic field, the circuit comprising:

an alternating excitation voltage source electrically coupled to a first magnetoimpedance sensor, the first magnetoimpedance sensor comprising a winding and a core material, the alternating excitation voltage source electrically coupled in parallel to a second magnetoimpedance sensor, the second magnetoimpedance sensor comprising a winding and a core material;

a biasing current source configured and electrically connected to apply a biasing DC current to a node coupled in parallel to both the first magnetoimpedance sensor and the second magnetoimpedance sensor; and a choke positioned between the biasing current source and the alternating excitation voltage, wherein the biasing current source is set to output a DC current value that operates to limit outputs of the first magnetoimpedance sensor to fall outside of a linear region of a B-H curve of the first magnetoimpedance sensor and to limit outputs of the second magnetoimpedance sensor to fall outside of a linear region of a B-H curve of the second magnetoimpedance sensor, and wherein the outputs of the first magnetoimpedance sensor and the second magnetoimpedance sensor are combined to generate a zero net output.

8. The circuit of claim 7 wherein the choke is a radio frequency choke positioned between the biasing current source and the node coupled in parallel to both the first magnetoimpedance sensor and the second magnetoimpedance sensor.

9. The circuit of claim 7 wherein the first magnetoimpedance sensor and the second magnetoimpedance sensor are the same.

10. The circuit of claim 7 wherein the alternating excitation voltage source is configured to output a square wave.

11. The circuit of claim 7 further comprising a synchronous detector, the detector electrically coupled to the node and configured to output a dc voltage indicative of an applied external magnetic field exposed to the first magnetoimpedance sensor and the second magnetoimpedance sensor.

12. The circuit of claim 7 wherein each of the first magnetoimpedance sensor and the second magnetoimpedance sensor comprise a core having a diameter of no more than 0.1 mm.

13. The circuit of claim 7 wherein the biasing current source is configured and electrically connected to apply a biasing DC current set to 5 volts or less to a node coupled in parallel to both the first magnetoimpedance sensor and the second magnetoimpedance sensor.

14. A circuit for determining an applied magnetic field, the circuit comprising:

an alternating excitation voltage source electrically coupled to a first magnetoimpedance sensor, the first magnetoimpedance sensor comprising a winding and a core material;

a biasing current source configured and electrically connected to apply a biasing DC current to a node coupled to the first magnetoimpedance sensor; and a high impedance current source positioned between the biasing current source and the alternating excitation voltage, wherein the biasing current source is set to output a DC current value that operates to limit outputs of the first magnetoimpedance sensor to fall outside of a linear region of a B-H curve of the first magnetoimpedance sensor.

15. The circuit of claim 14 wherein the high impedance current source is positioned between the biasing current source and the node.

16. The circuit of claim 14 wherein the alternating excitation voltage source is configured to output a square wave.

17. The circuit of claim 14 further comprising a synchronous detector, the detector electrically coupled to the node and configured to output a dc voltage indicative of an applied external magnetic field exposed to the first magnetoimpedance sensor.

18. The circuit of claim 14 wherein the first magnetoimpedance sensor comprises a core having a diameter of no more than 0.1 mm.

19. The circuit of claim 14 wherein the biasing current source is configured and electrically connected to apply a biasing DC current set to 5 volts or less to a node.

* * * * *